(12) United States Patent
Stieglauer

(10) Patent No.: US 11,018,029 B2
(45) Date of Patent: May 25, 2021

(54) METHOD FOR PRODUCING AN AT LEAST PARTLY PACKAGED SEMICONDUCTOR WAFER

(71) Applicant: United Monolithic Semiconductors GmbH, Ulm (DE)

(72) Inventor: Hermann Stieglauer, Blaustein (DE)

(73) Assignee: United Monolithic Semiconductors GmbH, Ulm (DE)

( * ) Notice: Subject to any disclaimer, the term of this patent is extended or adjusted under 35 U.S.C. 154(b) by 0 days.

(21) Appl. No.: 16/971,849

(22) PCT Filed: May 3, 2019

(86) PCT No.: PCT/EP2019/061359
§ 371 (c)(1),
(2) Date: Aug. 21, 2020

(87) PCT Pub. No.: WO2019/215027
PCT Pub. Date: Nov. 14, 2019

(65) Prior Publication Data
US 2021/0013052 A1    Jan. 14, 2021

(30) Foreign Application Priority Data

May 9, 2018 (DE) ..................... 10 2018 111 200.9

(51) Int. Cl.
*H01L 21/52* (2006.01)
*H01L 23/00* (2006.01)
*H01L 21/78* (2006.01)

(52) U.S. Cl.
CPC .............. *H01L 21/52* (2013.01); *H01L 21/78* (2013.01); *H01L 24/83* (2013.01); *H01L 2224/83009* (2013.01)

(58) Field of Classification Search
CPC ......... H01L 21/52; H01L 21/78; H01L 24/83; H01L 21/67253; H01L 37/32935;
(Continued)

(56) References Cited

U.S. PATENT DOCUMENTS 8,329,048 B2    12/2012  Zussy et al.
2005/0164028 A1*  7/2005  Reich-Sprenger .... C23C 14/046
                                                    428/660
(Continued)

FOREIGN PATENT DOCUMENTS

FR            2880184 A1    6/2006

OTHER PUBLICATIONS

International Search Report in PCT/EP2019/061359, dated Aug. 1, 2019.
(Continued)

*Primary Examiner* — Didarul A Mazumder
(74) *Attorney, Agent, or Firm* — Collard & Roe, P.C.

(57) ABSTRACT

A method for producing an at least partially housed semiconductor wafer is provided. This method comprises the steps of providing a semiconductor wafer which has components on its upper face and providing a cover disc, the surface of which at least partially covers the semiconductor wafer. After functionalizing the surface of the cover disc to form a functional layer, the upper face of the semiconductor wafer and the surface of the cover disc are joined together, followed by activating the functional layer using simultaneous chemical bonding of the semiconductor wafer and the cover disc such that the cover disc forms a housing for the semiconductor wafer.

9 Claims, 3 Drawing Sheets

Figure 1A:
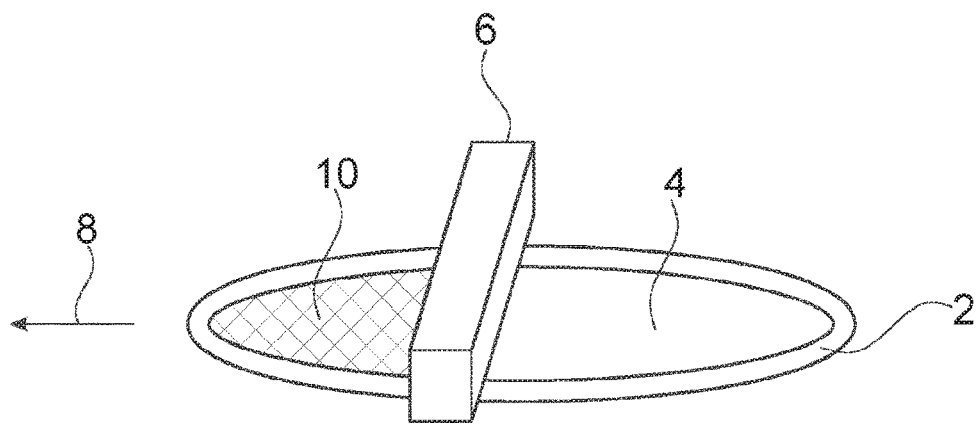

(58) Field of Classification Search
CPC ... H01L 21/568; H01L 21/561; H01L 23/293; H01L 24/97; G02B 5/3025; G02B 5/3083; G02B 1/14; G02B 5/3016
USPC .......................................................... 438/455
See application file for complete search history.

(56) References Cited

U.S. PATENT DOCUMENTS

| | | |
|---|---|---|
| 2013/0135317 A1 | 5/2013 | Shenoy |
| 2014/0138856 A1* | 5/2014 | Sekiguchi ............... B32B 5/022 257/790 |
| 2016/0035638 A1* | 2/2016 | Akiba ...................... B32B 3/08 257/790 |
| 2016/0061677 A1* | 3/2016 | Han ..................... G01L 9/0045 257/415 |
| 2016/0195658 A1* | 7/2016 | Yamauchi ............ G02B 5/3025 359/486.01 |
| 2018/0175283 A1* | 6/2018 | Akiyama ................ B32B 17/06 |
| 2018/0190938 A1* | 7/2018 | Wang .................. H01L 51/5256 |

OTHER PUBLICATIONS

Goesele U. et al. "Wafer bonding for microsystems technologies" Sensors and Actuators, A: Phys, Elsevier BV, NL, vol. 74. No. 1-3, (1999). pp. 161-168.

\* cited by examiner

METHOD FOR PRODUCING AN AT LEAST PARTLY PACKAGED SEMICONDUCTOR WAFER

CROSS REFERENCE TO RELATED APPLICATIONS

This application is the National Stage of PCT/EP2019/061359 filed on May 3, 2019, which claims priority under 35 U.S.C. § 119 of German Application No. 10 2018 111 200.9 filed on May 9, 2018, the disclosure of which is incorporated by reference. The international application under PCT article 21(2) was not published in English.

The invention relates to a method for producing an at least partially housed semiconductor wafer.

Interconnecting semiconductor substrates by means of permanent chemical bonds is known from the general prior art. Methods of this kind are typically referred to as anodic, direct or eutectic bonding. As is known, methods of this kind are used in the electronics industry for the production of optical and electrical components, in order to protect the components from environmental influences by attaching a housing. Furthermore, in the field of microsystems technology, wafer bonding is used to produce cavities which are required for sensors, for example. This can include, for example, a reference pressure chamber in an absolute pressure sensor or a vacuum chamber in an angular rate sensor.

It is, however, disadvantageous that methods of this kind typically include a temperature step which can be 200° C., for example, and reach up to 500° C. Furthermore, the semiconductor substrates that are to be connected are subjected to compressive forces and intermediate layers have to be formed. Electrical fields are also applied in individual cases. Consequently, anodic bonding and direct bonding are highly dependent on the material properties of the substrates, which considerably limits application to new products. In addition, thin metal layers are deposited during eutectic bonding, and this is associated with high expenditure.

Compound semiconductors which have a very high insulation property and thus are not open to conventional wafer bonding methods are often used in particular in the field of high-frequency components or in the field of power electronics. In compound semiconductors, the high electric fields necessary for eutectic bonding can also lead to damage to the components, due to discharge effects.

Another possibility could be to connect different semiconductors using adhesive bonding, although in this case an adhesive has to be used as an intermediate layer. However, a method of this kind is complicated, and in particular the production of an adhesive as an intermediate layer is problematic, even in compound semiconductors.

Proceeding from this prior art, the inventor has now addressed the problem of providing a method for producing an at least partially housed semiconductor wafer, which method overcomes the problems previously encountered in using wafer bonding and enables a reliable connection in the formation of a housing on a semiconductor wafer.

This problem is solved by the features of claim 1. Advantageous developments of the invention are each found in the dependent claims. These developments can be combined in a technologically meaningful way. The description, in particular in conjunction with the drawings, additionally characterizes and specifies the invention.

According to the invention, a method for producing an at least partially housed semiconductor wafer is provided, in which the following steps are carried out. First, a semiconductor wafer comprising components on its upper face is provided. Likewise, a cover disc is provided, the surface of which at least partially covers the semiconductor wafer. After functionalizing the surface of the cover disc in order to form a functional layer, the upper face of the semiconductor wafer and the surface of the cover disc are joined together. After activating the functional layer, a chemical bond between the semiconductor wafer and the cover disc is simultaneously produced such that the cover disc forms a housing for the semiconductor wafer. In this context the bonding is also referred to as "active surface bonding".

Accordingly, a method for permanently bonding the semiconductor wafer and the cover disc by means of chemical bonding is provided, the production of a housing, according to the invention, being neither dependent on the electrical properties nor on the material composition of the semiconductor substrate or the cover disc. Accordingly, it is possible to significantly expand the application possibilities in the field of microsystems technology or semiconductor manufacture, and to provide both housings for integrated circuits and applications such as cavities in microsystems technology. The method steps proposed by the invention lead to a reduction in production costs in the manufacture of components for microsystems technology or integrated circuits and, moreover, can also have improved electrical properties.

According to one embodiment of the invention, forming the functional layer comprises plasma treatment of the surface of the cover disc.

Since, unlike the semiconductor wafer, the cover disc typically does not comprise any active components, the chemical bonding of the semiconductor wafer and the cover disc is preferably initiated by forming the functional layer on the surface of the cover disc. For a permanent bond, both the cover disc and the semiconductor wafer are first cleaned, it being intended for the two discs to have an average roughness of 10 to 20 nm or less. By exposing the surface of the cover disc to a plasma, an ordered layer is formed on the surface of the cover disc, the properties of which layer are determined by the constituent parts of the plasma. For this purpose, a carrier gas is typically transported to corresponding electrodes and then ionized. The ions of the carrier gas are therefore responsible for the properties of the functional layer.

According to a further embodiment of the invention, the plasma treatment comprises moving the surface of the cover disc beneath a plasma rod, wherein the number and speed of the movements of the cover disc beneath the plasma rod define a layer thickness of the functional layer.

For this purpose, the plasma treatment is typically carried out on a plasma rod, electrodes of the plasma rod ensuring ionization of the carrier gas. The functional layer thereby deposited on the surface of the cover disc is applied in the form of ordered molecules. For this purpose, the substrate is moved beneath the plasma rod. The speed and the number of passes of the cover disc beneath the plasma rod define the thickness of the functional layer.

According to a further embodiment of the invention, activating the functional layer comprises irradiation using light of a predetermined wavelength, preferably in the UV range.

After the previously described treatment of the surface of the cover disc using the plasma rod, the deposited layer is initially inactive. The inactive state is maintained until the functional layer is activated using light which is in the near UV range, for example. By means of activation and immediate bonding, covalent bonds between the molecules of the functional layer and the semiconductor wafer are formed between the surface of the cover disc and the upper face of the semiconductor wafer by means of surface contact with the semiconductor wafer. These then lead to a chemical bond between the semiconductor wafer and the cover disk, which bond is permanent.

According to a further embodiment of the invention, the process steps are carried out in a sealed process chamber, wherein the composition and pressure of a gas atmosphere can be adjusted during the activation of the functional layer and the joining of the discs.

Accordingly, a sealed process chamber having a gas supply and pressure regulation can be used as a variant such that a desired pressure and a desired gas composition can be adjusted during the activation of the functional layer and the chemical bonding. This allows defined gas or pressure compositions in cavities which are present between the semiconductor wafer and the cover disc, which compositions are hermetically enclosed in the housing thus formed. The cover disc may be provided as a silicon wafer, as a semiconductor substrate of a compound semiconductor, made of quartz or glass, although other materials are not excluded.

A procedure of this kind makes it possible to produce a wide variety of products from the fields of microsystems technology, power electronics or high-frequency electronics. In this case a hermetic housing which protects against environmental influences, such as moisture, is simultaneously provided. The inclusion of air, for example, can also reduce power losses in high-frequency electronics.

According to a further embodiment of the invention, the cover disc is structured on its upper face facing the semiconductor wafer such that individual component groups are arranged on the upper face of the semiconductor wafer in cavities on the surface of the cover disc.

As already mentioned, in order to reduce power losses, a cavity filled with a gas can be provided for individual or all component groups on the upper face of the semiconductor wafer, in order to reduce the dielectric losses. A housing of this kind can be used both for the production of electrical components and in microsystems technology.

According to a further embodiment of the invention, the semiconductor wafer is thinned from the side opposite the upper face and is subsequently contacted from this rear face.

This rear face process which is known per se now allows component groups on the upper face of the semiconductor wafer to be provided with electrical connections by means of corresponding contact surfaces on the rear face, which electrical connections can be used as connection surfaces in subsequent process steps.

According to a further embodiment of the invention, individual assemblies are preferably separated by means of sawing, preferably along structural elements on the cover disc.

According to this procedure, a hermetically housed component can be created which can be supplied for further use after separation.

In this case, the components of the semiconductor wafer can be provided in the form of microelectronic or micromechanical components which are connected to electronic components, preferably high-frequency or power electronic components.

According to a further embodiment of the invention, the cover disc is used as a carrier during rear face processing of the semiconductor wafer.

Usually, the semiconductor wafer has to be temporarily bonded to a carrier in order to thin the semiconductor wafer and to produce the vias in the semiconductor wafer. In this procedure this is not necessary, since the semiconductor wafer can already be used with the cover disk which is used as a carrier wafer for the rear face processing.

Figure 1B:
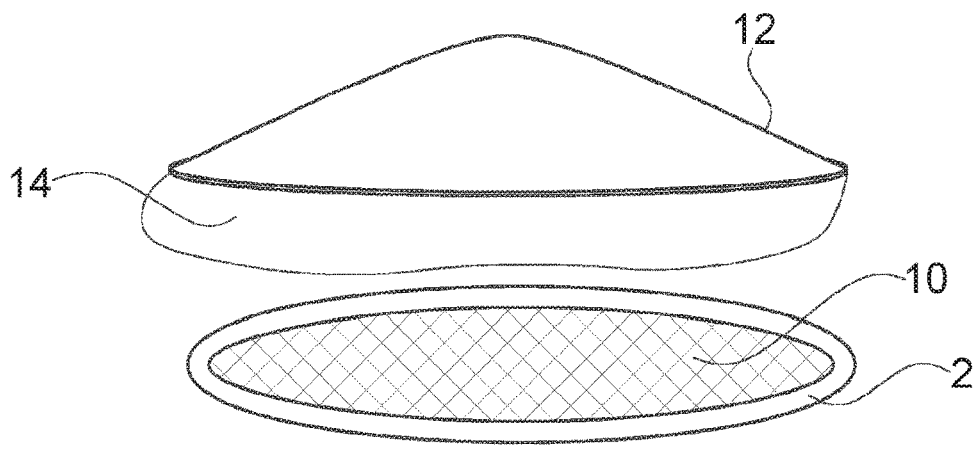
Figure 1C:
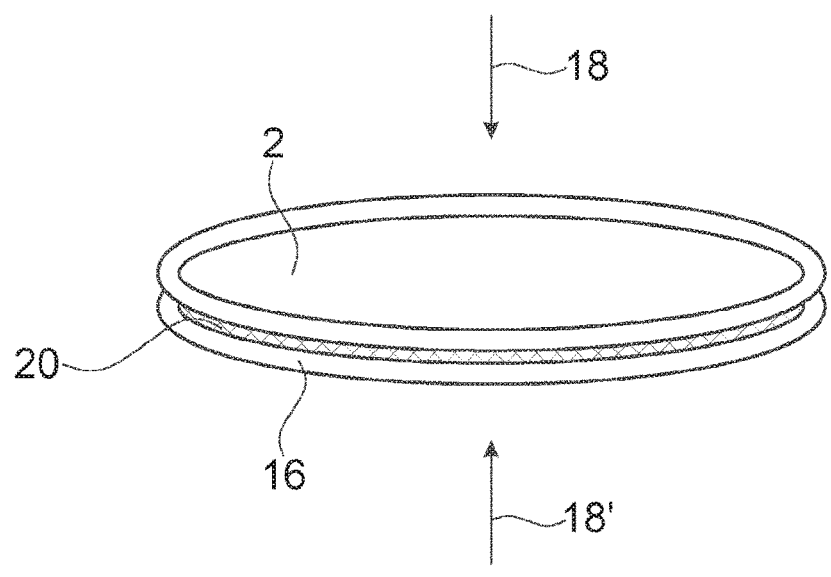
Figure 2A:
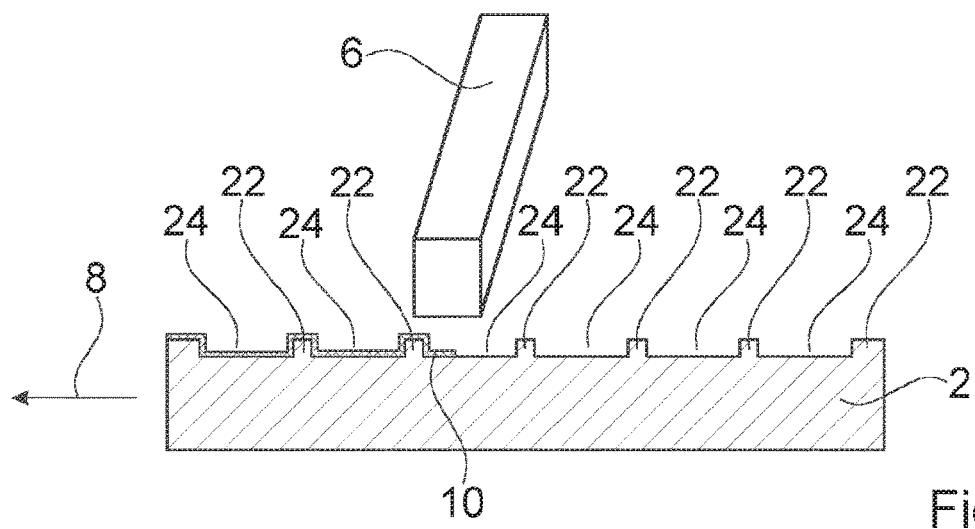
Figure 2B:
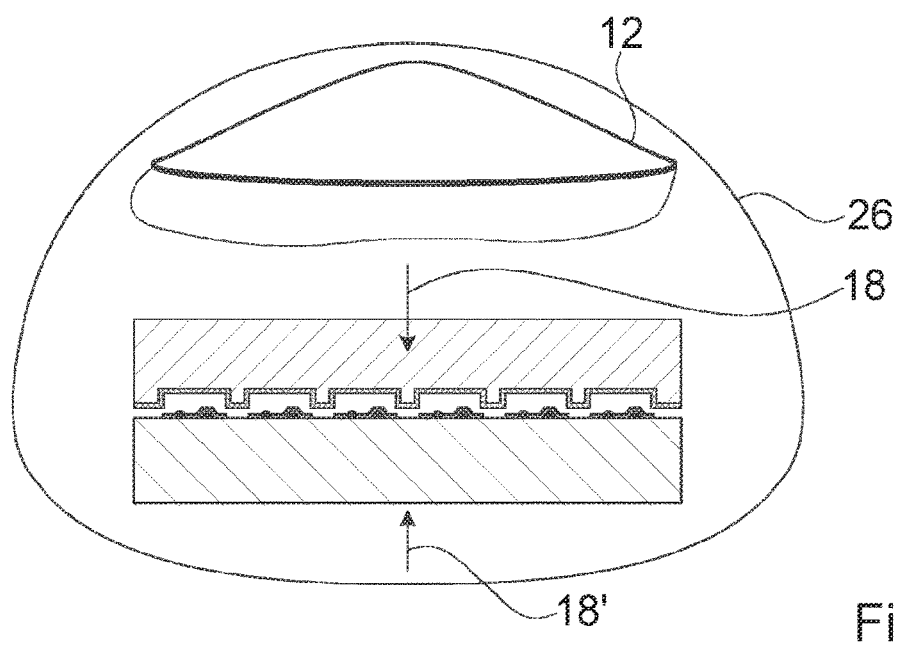
Figure 2C:
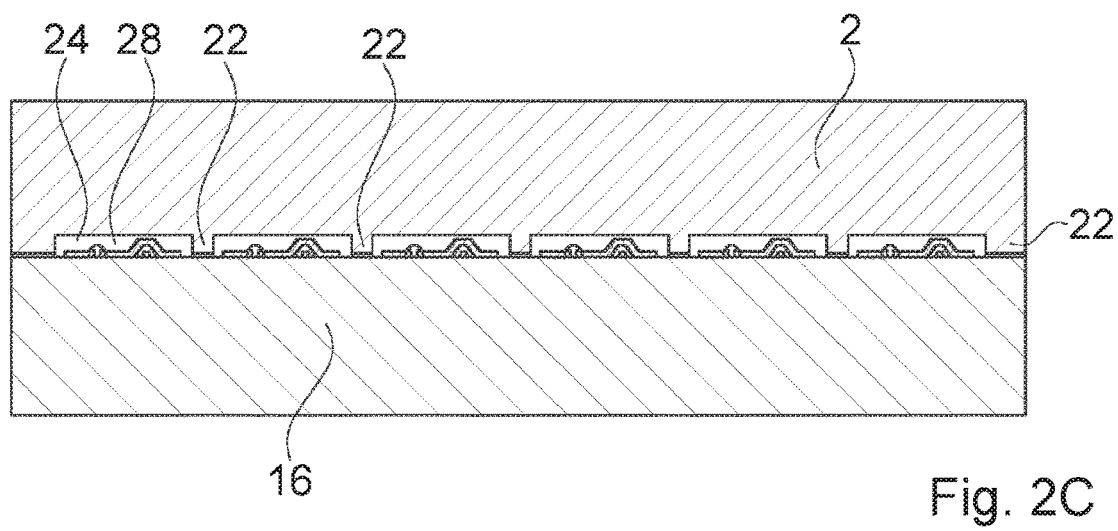
Figure 3A:
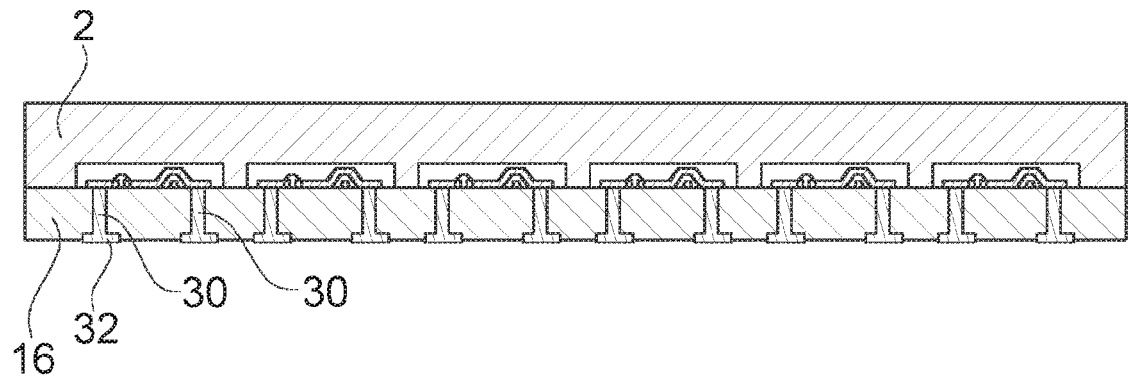
Figure 3B:
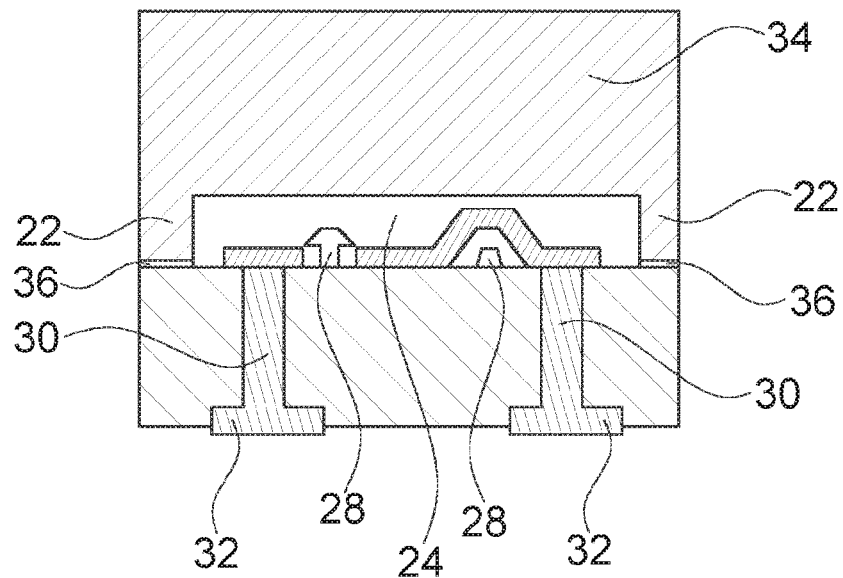

Some exemplary embodiments will be explained below in greater detail with reference to the drawings, in which:

FIG. 1A is a schematic side view of a first process step of a first embodiment of a method according to the invention, FIG. 1B is a side view of a second process step of the first embodiment, FIG. 1C is a side view of a third process step of the first embodiment, FIG. 2A is a side view of a first process step of a method according to the invention in accordance with a second embodiment, FIG. 2B is a side view of a second process step of the second embodiment, FIG. 2C is a side view of a third process step of the second embodiment, FIG. 3A is a side view of a further process step of the method according to the invention, FIG. 3B is a side view of a further process step of the method according to the invention.

In the figures, identical or functionally identical components are provided with the same reference numerals.

A first embodiment of a method according to the invention for producing a housed semiconductor wafer will be described below with reference to FIG. 1A to 1C. FIG. 1A shows that a cover disc 2 is provided, the surface 4 of which typically corresponds to the dimensions of a semiconductor wafer. In other embodiments, however, the size of the cover disk 2 may be selected so as to be smaller, for example, such that a semiconductor wafer is only partially covered. A plasma rod 6 is arranged on the surface 4 of the cover disc 2, which plasma rod can ionize the region between the surface 4 and the plasma rod 6 by means of suitable electrodes such that a carrier gas, which is not shown in FIG. 1A, is ionized and then deposited on the surface 4. Consequently, provided the cover disc 2 is pulled through under the plasma rod 6 one or more times as shown in FIG. 1 using the directional arrow 8, a functional layer 10 is formed, the thickness of which can be influenced by the process management, i.e. the number and speed of the passes of the cover disc 2 beneath the plasma rod 6. Now that the functional layer 10 has been generated having the desired thickness, the functional layer 10 is initially inactive following the plasma treatment.

As shown in FIG. 1B, the functional layer 10, which is formed over the entire surface 4 of the cover disc 2, can be activated by means of light from a light source 12. The light source 12, which emits, for example, light 14 in the near UV range, causes an activation of the functional layer 10 in correspondingly selected lighting conditions.

In the next step, as shown in FIG. 1C, a semiconductor wafer 16 is now provided, a bonding procedure between an upper face 20 of the semiconductor wafer 16 and the functional layer 10 of the cover disc 2 being generated by immediately bringing the cover disc 2 and the semiconductor wafer 16 into contact, covalent bonds of the activated functional layer and the upper face 20 of the semiconductor wafer 16 being produced due to the surface contact. These covalent bonds lead to a permanent chemical bond between the cover disc 2 and the semiconductor wafer 16. The contacting of the cover disc 2 and the semiconductor wafer 16 is shown using the displacement directions 18 and 18' in FIG. 1C.

The process steps described in conjunction with FIG. 1A to 1C can be used, for example, to provide a housing by means of the cover disc 2 that covers components (not shown in FIG. 1A to 1C) on the upper face 20 of the semiconductor wafer 16. This corresponds to the encapsulation of, for example, optical or electronic components in the electronics industry.

A second embodiment of the method according to the invention will be described below with reference to FIG. 2A to 2C. For clarification, however, the differences to the method described in conjunction with FIG. 1A to 1C are substantially explained.

As can be seen from FIG. 2A, the cover disc 2 is structured on its surface 4 in such a way that corresponding structural elements 22 have been created, between which cavities 24 are formed. The structuring by means of the structural elements 22 can in this case take place in the form of a grid. By means of the plasma rod 6, the functional layer 10 is formed in turn by movement along the directional arrow 8. The functional layer 10 is activated in a process chamber 26 in which the cover disc 2, the semiconductor wafer 16 and the light source 12 are arranged. By supplying a desired gas mixture or adjusting a pressure of the gas mixture, after activation by means of the light source 12, a chemical bond of the cover disk 2 and the semiconductor wafer 16 can now be created by contacting by means of the movement along the displacement directions 18 and 18', in which bond gas having a desired composition or density is present in the region of the cavities 24.

The result of this process management is shown, in a further enlarged view, in FIG. 2. It can be seen that in the cavities 24, which are delimited by the structural elements 22, a defined atmosphere prevails such that the components indicated by the reference numeral 28 are surrounded by the defined gas atmosphere in the cavity 24. A procedure of this kind can be used both in high-frequency electronics to reduce power losses and in microsystems technology for the production of cavities required for sensors. Thus, a reference pressure chamber in an absolute pressure sensor or a vacuum chamber of an angular rate sensor, for example, can be provided in this way. In high-frequency or power electronics, a gas-filled cavity is also advantageous due to the lower dielectric values.

Further method steps are explained below with reference to FIGS. 3A and 3B.

It is thus shown in FIG. 3A that the semiconductor wafer 16 is thinned from a side opposite the upper face 20 such that rear face metallizations and contacts can be formed. These can lead the components 28 though corresponding vias 30 to rear face electrodes 32.

After a separation, the result of which is shown in an enlarged view in FIG. 3B, a finished electronic component is obtained which is hermetically shielded from and sealed against the environment by means of the housing 34 formed from the material of the cover disc 2. The separation is in this case preferably carried out such that the structural elements 22 are retained in part. Regions in which bonds have been produced by means of the active surface bonding are indicated schematically by reference numeral 36 in FIG. 3B. The cavity 24 can be filled with gas.

In other methods, the cover disc 2 can be used as a carrier during rear face processing of the semiconductor wafer 16, in order produce vias in the semiconductor wafer 16 or to thin the semiconductor wafer 16.

The features indicated above and in the claims and the features which can be seen in the figures can be implemented advantageously both individually and in various combinations. The invention is not limited to the embodiments described, but can be modified in a number of ways within the scope of knowledge of a person skilled in the art.

LIST OF REFERENCE NUMERALS 2 cover disc
4 surface
6 plasma rod
8 directional arrow
10 functional layer
12 light source
14 light
16 semiconductor wafer
18 displacement directions
20 upper face
22 structural elements
24 cavity
26 process chamber
28 components
30 via
32 rear face electrode
34 housing
36 bonding region

The invention claimed is:

1. A method for producing an at least partially housed semiconductor wafer, comprising the steps of:
   providing a semiconductor wafer which has components on an upper face;
   providing a cover disc, a surface of which at least partially covers the semiconductor wafer,
   functionalizing the surface of the cover disc by forming a functional layer by plasma treating the surface of the cover disc and activating the functional layer by an irradiation with light,
   immediately after activating the functional layer, joining the upper face of the semiconductor wafer and the surface of the cover disc for chemical bonding of the semiconductor wafer and the cover disc by forming covalent bonds between molecules of the functional layer and the semiconductor wafer such that the cover disc forms a housing for the semiconductor wafer.

2. The method according to claim 1, wherein the plasma treating comprises moving the surface of the cover disc beneath a plasma rod, wherein the number and speed of the movements of the cover disc beneath the plasma rod define a layer thickness of the functional layer.

3. The method according to claim 1, wherein activating the functional layer comprises irradiation using light of a predetermined wavelength, preferably in the UV range.

4. The method according to claim 1, wherein the process steps are carried out in a sealed process chamber, wherein the composition and pressure of a gas atmosphere can be adjusted during the activation of the functional layer and the joining of the semiconductor wafer and the cover disc.

5. The method according to claim 1, wherein the cover disc is structured on an upper face which faces the semiconductor wafer such that individual component groups are arranged on the upper face of the semiconductor wafer in cavities on the surface of the cover disc.

6. The method according to claim 1, wherein the semiconductor wafer is thinned from an opposite side of the upper face and can subsequently be contacted from the opposite side.

7. The method according to claim 6, wherein individual assemblies are preferably separated by sawing, preferably along structural elements on the cover disc.

8. The method according to claim 1, wherein the components of the semiconductor wafer are provided in the form of microelectronic or micromechanical components which are connected to electronic components, preferably high-frequency components.

9. The method according to claim 1, wherein the cover disc is used as a carrier during rear face processing of the semiconductor wafer.

\* \* \* \* \*